United States Patent
Hämäläinen et al.

(10) Patent No.: US 8,041,315 B2
(45) Date of Patent: Oct. 18, 2011

(54) METHOD AND A DEVICE FOR ADJUSTING POWER AMPLIFIER PROPERTIES

(75) Inventors: Miikka Hämäläinen, Espoo (FI); Esko Järvinen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/547,240

(22) PCT Filed: Feb. 25, 2004

(86) PCT No.: PCT/FI2004/000098
§ 371 (c)(1),
(2), (4) Date: Aug. 25, 2005

(87) PCT Pub. No.: WO2004/077664
PCT Pub. Date: Sep. 10, 2004

(65) Prior Publication Data
US 2006/0178121 A1    Aug. 10, 2006

(30) Foreign Application Priority Data
Feb. 25, 2003   (FI) ...................................... 20030272

(51) Int. Cl.
*H01Q 11/12*   (2006.01)
*H04B 1/04*   (2006.01)
(52) U.S. Cl. .................. 455/127.1; 455/522; 455/552.1; 330/129
(58) Field of Classification Search .... 455/127.1–127.5, 455/114.2, 114.3, 522, 552.1; 330/129
See application file for complete search history.

(56) References Cited

U.S. PATENT DOCUMENTS

| | | | |
|---|---|---|---|
| 4,442,407 A | 4/1984 | Apel | 330/128 |
| 4,730,622 A | 3/1988 | Cohen | 330/207 |
| 5,493,255 A | 2/1996 | Murtojarvi | 330/296 |
| 5,880,633 A * | 3/1999 | Leizerovich et al. | 330/84 |
| 5,894,498 A | 4/1999 | Kotzin et al. | 375/295 |
| 6,160,449 A * | 12/2000 | Klomsdorf et al. | 330/149 |
| 6,166,598 A * | 12/2000 | Schlueter | 330/127 |
| 6,262,629 B1 * | 7/2001 | Stengel et al. | 330/124 R |
| 6,292,054 B1 | 9/2001 | Ma et al. | 330/126 |
| 6,294,956 B1 | 9/2001 | Ghanadan et al. | 330/124 |
| 6,301,467 B1 | 10/2001 | Jarvinen et al. | 455/80 |
| 6,320,464 B1 * | 11/2001 | Suzuki et al. | 330/151 |

(Continued)

FOREIGN PATENT DOCUMENTS

CN    1282143 A    1/2001

(Continued)

OTHER PUBLICATIONS

Office Action issued by the Chinese Patent Office on Oct. 9, 2009, in Chinese patent application No. 2004800051385 (8 pages) and English language translation thereof (9 pages).

(Continued)

*Primary Examiner* — Edward Urban
*Assistant Examiner* — Rui Hu

(57) ABSTRACT

A method and a device for tuning power amplifier (PA, 203) properties such as back-off. A peak-to-average value (PAR) of the amplifier input signal is first obtained by control means (206) and then used for adjusting the power amplifier (203) with tuning means (204, 208, 210) functionally connected to the amplifier (203). The suggested solution is advantageously exploited in a wireless communications device like a mobile terminal to optimize the performance thereof by, for example, reducing the power dissipation in the transmitter.

38 Claims, 4 Drawing Sheets

U.S. PATENT DOCUMENTS

| | | | |
|---|---|---|---|
| 6,349,216 B1* | 2/2002 | Alberth et al. | 455/550.1 |
| 6,369,648 B1* | 4/2002 | Kirkman | 330/43 |
| 6,438,360 B1* | 8/2002 | Alberth et al. | 455/110 |
| 6,492,867 B2* | 12/2002 | Bar-David | 330/10 |
| 6,535,066 B1* | 3/2003 | Petsko | 330/285 |
| 6,617,920 B2* | 9/2003 | Staudinger et al. | 330/149 |
| 6,674,999 B2* | 1/2004 | Ramachandran | 455/115.1 |
| 6,725,021 B1* | 4/2004 | Anderson et al. | 455/115.1 |
| 6,774,719 B1* | 8/2004 | Wessel et al. | 330/136 |
| 6,794,935 B2* | 9/2004 | Klomsdorf et al. | 330/129 |
| 6,853,244 B2* | 2/2005 | Robinson et al. | 330/51 |
| 7,046,090 B2* | 5/2006 | Veinblat | 330/285 |
| 7,130,596 B2* | 10/2006 | Ramachandran | 455/127.1 |
| 7,139,534 B2* | 11/2006 | Tanabe et al. | 455/108 |
| 7,308,042 B2* | 12/2007 | Jin et al. | 375/297 |
| 7,471,738 B2* | 12/2008 | Chan et al. | 375/297 |
| 2002/0017954 A1* | 2/2002 | Hau et al. | 330/149 |
| 2002/0084844 A1* | 7/2002 | Monroe | 330/51 |
| 2002/0171477 A1* | 11/2002 | Nakayama et al. | 330/53 |
| 2003/0091123 A1* | 5/2003 | Dartois | 375/297 |
| 2003/0155978 A1* | 8/2003 | Pehlke | 330/296 |
| 2004/0061555 A1* | 4/2004 | Lynch | 330/136 |
| 2004/0100326 A1* | 5/2004 | Cobley | 330/279 |
| 2004/0131129 A1* | 7/2004 | Harron et al. | 375/298 |
| 2004/0208260 A1* | 10/2004 | Chan et al. | 375/297 |
| 2005/0030101 A1* | 2/2005 | Ichitsuho et al. | 330/285 |
| 2006/0202757 A1* | 9/2006 | Ichitsubo et al. | 330/140 |
| 2007/0087707 A1* | 4/2007 | Blair et al. | 455/127.1 |

FOREIGN PATENT DOCUMENTS

WO     WO 02/078181     10/2002

OTHER PUBLICATIONS

Abstract of US patent No. 6,160,449, which corresponds to CN 1282143 (1 page).

Chinese Office Action dated Apr. 26, 2011 in parallel Chinese Patent Application No. 200480005138.5 (8 pages) together with English translation of same (9 pages) (17 pages total).

* cited by examiner

METHOD AND A DEVICE FOR ADJUSTING POWER AMPLIFIER PROPERTIES

CROSS-REFERENCE TO RELATED APPLICATION

This is the U.S. National Stage of International Application Serial Number PCT/FI2004/000098 filed 25 Feb. 2004 and published in English on Sep. 10, 2004 based on Finnish patent application 20030272 filed Feb. 23, 2003 from which priority is claimed.

BACKGROUND OF THE INVENTION

1. Technical Field

The present invention relates generally to a method and a device for adjusting power amplifier properties. Particularly the invention concerns techniques exploiting PAR (Peak to Average Ratio) in the adjustment.

2. Discussion of Related Art

Many traditional communication systems utilize modulation formats, for example GSMK (Gaussian Minimum Shift Keying) in the case of GSM (Global System for Mobile communications), wherein amplitude envelope stays constant resulting in low, in principle zero, PAR values making possible the use of affordable and non-linear amplifiers. As a generalization, if the PAR value is high, which is due to the large variance of the signal amplitude, amplifier circuit linearity must be improved to achieve low enough ACLR (Adjacent Channel Leakage power Ratio) values. Therefore, an amplifier must have enough amplification headroom, so called "back-off", to avoid distortions in an output signal. The distortions in the signal include e.g. second- and third-order harmonics which leak into the adjacent channels. This leakage is identical to the intermodulation caused by two sinusoidal signals input to an amplifier. Moreover, high PAR values are undesirable as they place considerable requirements for the dynamic range of A/D and D/A converters without forgetting large power dissipation in the highly linear and large back-off amplifiers. The circuit linearity can be measured as a back-off number from the amplifier input compression point or some other specific point in the radio chain.

FIG. 1 discloses Pinput-Poutput characteristics of a power amplifier, wherein active power ranges of two signals, one of signal 102 with higher PAR value PARh and another of signal 104 with lower PAR value PAR1, both signals having a common average power Pavg, are illustrated with dotted lines. As indicated by the figure, the amplifier has to be designed according to maximum possible Pavg and PAR values, which is not optimal whenever the actual operational range is something less demanding. The reduction in efficiency resulting from too high back-off can be estimated by the following equation, which defines the efficiency η of the class-B amplifier as a function of the output power Poutput $$\eta = \eta_{max} \sqrt{P_{output}/P_{max}}$$

wherein Pmax is the maximum output power and $\eta_{max}$ is the efficiency at Pmax. Considering an ideal class-B amplifier with a maximum efficiency of π/4 and applying Pmax/Pavg (PAR) value of 3.2 dB, being typical PAR for WCDMA (Wideband Code Division Multiple Access) PAs, and 5.5 dB, respectively common for HSDPA (High Speed Downlink Packet Access) PAs, efficiencies of 54.3% and 41.7% are achieved. Thus, the efficiency of the WCDMA PA is reduced by the factor of 0.768 if the HDSPA PA is utilized for both purposes.

In WCDMA and multicarrier, e.g. OFDM (Orthogonal Frequency Division Multiplexing), systems amplifier design and control is particularly relevant issue as the modulation techniques thereof are non-constant in order to achieve higher data rates than constant techniques like GMSK can provide. The fundamental idea behind the WCDMA is to allow several users to share the same spectrum by spreading the data across the available frequency band. This can be achieved if the user's data signal is multiplied with a pseudorandom "chip" sequence of a higher bit rate to fill the frequency band. In the receiving end the single user's data can be retrieved from the overall received signal by cross-correlating the received signal with a synchronized copy of the chip signal. The procedure is called dispreading. Naturally, chip sequences should be designed to be orthogonal so as to be maximally separable in the reception sense. On the other hand, OFDM is a multicarrier system wherein the available frequency band includes several narrowband carriers with overlapping sidebands. If each carrier's spectrum is ideally shaped like a sinc function having zero crossings every f0, and the carrier separation is f0 as well, the resulting overall spectrum is spectrally efficient (dense), and at the same time, the co-channel interference is retained to be low. In practice, OFDM transceivers convert a data signal to PSK (Phase Shift Keying) or QAM (Quadrature Amplitude Modulation) symbols after which the serial stream is converted to a parallel form, modulated with inverse FFT (Fast Fourier Transform), serialized and finally converted to analog for transmission. The receiver executes the aforesaid process in reverse order utilizing e.g. FFT.

The difference between the average and peak power of the signal, which can be presented via PAR, results from the fact that multiple carriers may add together either constructively to form a high level signal or destructively to form a very low level signal. Therefore, as the number of sub-carriers is increased, also the PAR inevitably increases. The same phenomenon occurs in the WCDMA system as the PAR typically increases with the number and types of codes transmitted. A WCDMA system supports multirate data transfer in two major ways, namely by using a variable spreading factor and by utilizing a multicode approach, wherein higher data rates are achieved via use of several parallel codes. In addition, forthcoming HSDPA based on a HS-DSCH (High Speed Downlink Shared Channel) is a packet data service in WCDMA downlink to transmit data up to 20 Mbps (MIMO, Multiple Input Multiple Output, systems with multiple transmitter and receiver antennas). It features a concept of AMC (Adaptive Modulation and Coding) enabling utilization of adaptive modulation and coding techniques in order to maximize the data throughput in changing channel conditions. The channel conditions can be estimated, for example, based on feedback from the receiver and use AMC instead of fast power control to compensate for the variations in the channel estimate. Users close to the base station may be assigned higher order modulation with higher code rates (e.g. 64 QAM and R=¾ turbo codes), but the lower modulation-order, e.g. QPSK, and code rate will be taken into use as the distance from the base station increases and/or the degradation in the channel conditions is detected.

It's obvious that with an adaptive system like AMC in WCDMA HSDPA, PAR values may be high as the system intermittently changes transmission parameters affecting also the amplitude envelope and extends its possible range. It's admitted that many solutions have been proposed for minimizing PAR, see, for example, U.S. Pat. Nos. 6,294,956, 6,292,054 and 5,894,498 for reference. However, despite the existing solutions, PAR fluctuations, which normally originate from the changes in the utilized transmission techniques with possibly varying modulation types and/or number of multicodes, cannot be completely removed. Also, in the case of multicode transmission, PAR of the amplified signal may vary based on gain factors i.e. power offsets between different codes. This is the case especially in HSDPA (High Speed Downlink Packet Access) service. These gain factors between codes are signalled by higher layers in the network. As presented above, in the worst case the PAR in HSDPA uplink signal can even be ~2.3 dB higher compared to the standard WCDMA scenario. Recalling that the PAR value directly affects to the power consumption of a PA and considering, for example, mobile terminals' quite limited power supply in a form of compact and relatively low capacity batteries, it surely isn't a surprise that power amplifiers are one of the most power hungry building blocks in a terminal as their output power back-off is typically designed according to the worst case PAR and Pavg values possible in the system.

SUMMARY OF INVENTION

The object of the present invention is to alleviate aforesaid problems originated from PAR variations. The object is achieved with a method and a device enabling the adaptive tuning of PA properties according to the PAR value of that moment. For example, in order to increase talk time remarkably in a mobile terminal, the power amplifier back-off can be adjusted as a function of the PAR value of the transmitted signal. A device utilizing the invention, such as a transceiver in a base station or mobile terminal, is, e.g. in the case of WCDMA, aware of power offsets between codes and number of transmitted codes. Consequently, the device can be programmed and configured so that it knows the PAR value of the transmitted signal during the connection to a network. Additional detectors or signals are thus not necessarily required. Based on the knowledge of the current PAR, the device is able to tune the amplifier's back-off without computationally exhaustive calculations.

The invention offers several advantages over prior art. Reduction in power consumption is in the best case (HSDPA) ~60 mA and also heat problems decrease. Correspondingly, amplifier efficiency is increased. Furthermore, the proposed approach for amplifier adjustment is relatively simple to implement and applicable to already existing solutions without need to twiddle with complex DSP SW based control algorithms.

A method according to the invention for tuning a power amplifier to be performed by an electronic device, comprises the steps of obtaining a maximum peak-to-average value related to an input signal of the amplifier, and adjusting at least one amplifier parameter according to said peak-to-average value.

In another aspect of the invention a circuit arrangement for tuning a power amplifier, comprises control means for obtaining a peak-to-average value related to the amplifier input signal and providing control information based on said peak-to-average value, and tuning means for receiving said control information and adjusting at least one amplifier parameter, said amplifier functionally connected to the tuning means, according to said control information.

In a further aspect of the invention a wireless communications device operable in a telecommunications network, comprises processing means and memory means for processing and storing instructions and data, control means for obtaining a peak-to-average value related to an input signal of an amplifier and providing control information based on said peak-to-average value, and tuning means for adjusting at least one amplifier parameter, said amplifier functionally connected to the tuning means, according to said control information.

The term "peak-to-average" (PAR) refers herein to a value which is the ratio of the peak envelope power to the average power. Sometimes the term "crest factor" is used exactly in the same manner but also a partly differing interpretation exists according to which the crest factor is the ratio of signal maximum value to its RMS (Root Mean Square Value). Then the resulting value is 3 dB greater than the corresponding PAR. However, as there undoubtedly are varying ways to represent substantially the same properties of the signal, the term PAR shall be interpreted broadly.

In an embodiment of the invention a WCDMA mobile terminal starts transferring data over the air interface. Prior to data transmission the terminal deduces the PAR of the signal to be transmitted by means of the transfer mode (WCDMA/HSDPA) information and tunes PA back-off to reduce the power consumption thereof.

BRIEF DESCRIPTION OF THE DRAWINGS

Hereinafter the invention is described in more detail by reference to the attached drawings, wherein FIG. 1 discloses a PA operation curve and PAR values of two signals.

DETAILED DESCRIPTION OF THE INVENTION

Figure 1:
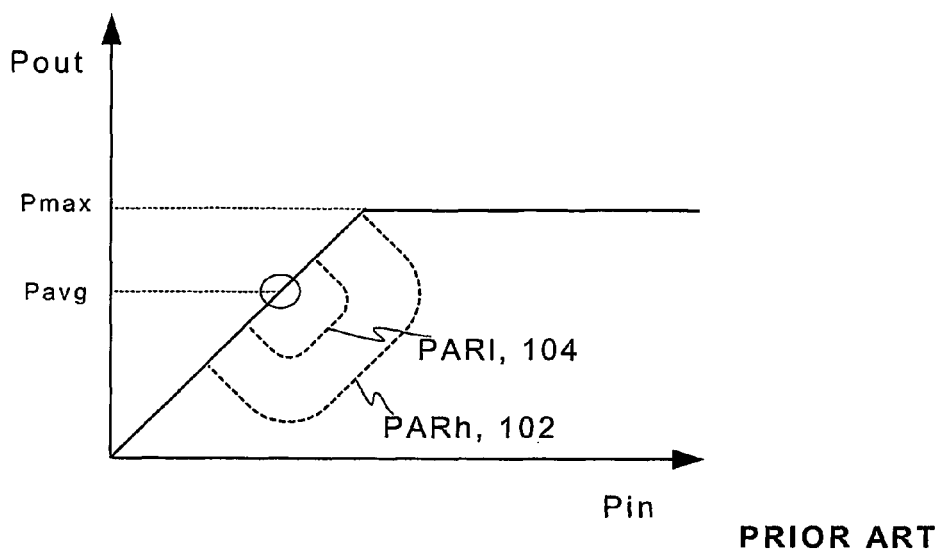

FIG. 1 was already described in conjunction with the description of the prior art. Whenever PAR and/or average power of the signal vary, the amplifier causes unnecessary power consumption as the PA back-off is gratuitously high.

Figure 2:
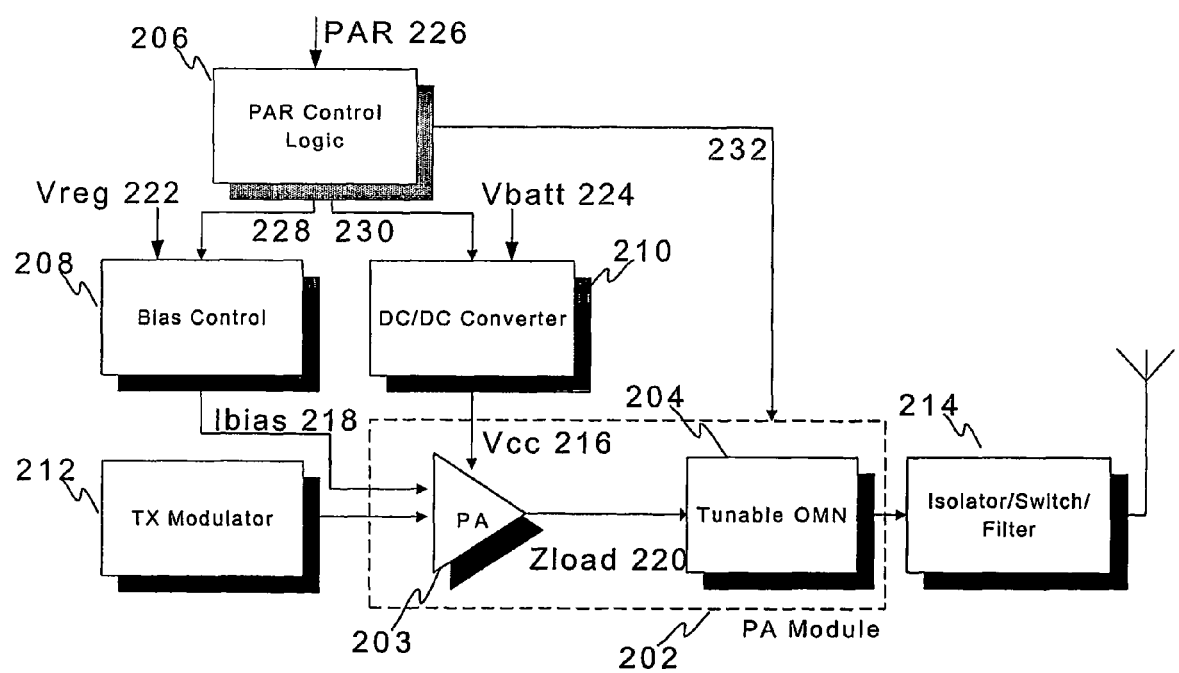
FIG. 2. illustrates an overall concept of the invention via a block diagram of a tunable transmitter arrangement targeted for a communication device, the transmission signals thereof having a variable PAR.

Referring to FIG. 2, the basic inventive concept is depicted as components of a circuit arrangement like a tunable transmitter for a communication device transferring signals of variable PAR. Basically similar means which have been used to improve the efficiency of a power amplifier operating at back-off can be used for improving the efficiency of an amplifier operating at signals with variable PAR ratios. However, the control concept needed in this case is totally different than the one prior art solutions exploit when improving the efficiency as a function of the power level.

The control signals 228, 230, 232 generated by the PAR control logic block 206 are used to adjust other transmitter components according to the peak-to-average ratio PAR 226 of the transmitted signal. PAR 226 may be received from the network via signalling information and possibly passed to the control logic 206 by some other element of the terminal like a radio DSP. Alternatively, PAR 206 value can be derived from implicit information like a transfer mode if, for example, the logic 206 stores a table to link different transfer modes to different PAR values. The same control block 206 can also be utilized for tuning the system according to the average power level if necessary. The ultimate goal is to control the power amplifier 203 in a way that optimizes its performance in most situations. To approach the optimum scenario in this particular example three parameters Vcc 216, Ibias 218 and Zload 220 are adjusted according to the transmitted signal by tuning the DC/DC-converter 210 (Direct Current to Direct Current) providing battery voltage Vbatt 224 or some other suitable supply voltage to the PA 203, bias control 208 which also takes a regulating voltage Vreg 222 as an input, and tunable output matching network (OMN) 204 included in the PA module 202. In a general case all the parameters can be controlled simultaneously but typically at least one or more parameters are used if, for example, some of the blocks are not available. Additionally, FIG. 2 includes a TX (transmitter) modulator 212 and an isolator, a switch and/or a filter 214, all typical elements of an RF (Radio Frequency) transmitter.

In the following, numeric values for a WCDMA power amplifier current consumption are calculated to find out how significant this effect is in practice.

Vcc=3.3 V
Poutput=24 dBm (max. Pavg)
Efficiency=40%

EXAMPLE A

'Normal' WCDMA PA Optimized for PAR=3.2 dB

Pdc=Poutput/η=628 mW and current taken from the
battery Idc=Pdc/Vcc=190 mA.

EXAMPLE B

HSDPA PA with Worst Case PAR =5.5 dB and
'Normal' WCDMA PA without Tuning According to
PAR Pdc=Poutput/(0.768η)=818 mW and Idc=248 mA.

Calculations above show that when the amplifier designed for the requirements of HSDPA is used in the 'normal' WCDMA case, 58 mA current is wasted at maximum Poutput compared to the optimal solution. At low power levels the factor of reduction remains the same though the absolute difference in battery currents decreases. It is noted that in practice the reduction in efficiency is even higher because class-AB operation has to be used to meet the linearity requirements.

The most common way to control the operation of the power amplifier is to adjust the bias currents of amplifier stages. Therefore the bias signal Ibias 218, output of the bias controller block 208 is not necessarily only one signal but a group of signals used to adjust the operation of the amplifier 203. When maximum possible PAR decreases, it is often possible to reduce the bias currents as well and still meet the linearity requirements. From the realization point of view it may be advantageous to integrate the bias control 208 into the PAR control block 206.

Another possibility is to drop the collector (drain) voltage of the amplifier stages (typically output stage only) by using a DC/DC-converter 210. In case of switching the PAR-value from 5.5 dB to 3.2 dB and keeping Pavg constant, it is possible to reduce the value of Vcc 216 by the factor of 0.768. If the supply voltage Vcc 216 in the first case is 3.3 V, it can be dropped down to 2.6 V for lower PAR. Because DC/DC-converters can operate with an efficiency of over 90%, this is a very effective way of reducing the current taken from the battery.

The third alternative is to adjust load impedance Zload 220 of the power amplifier 203 in a way that it increases as the peak-to-average ratio decreases. For example, the load impedance could be increased by a factor of 1.7 when the PAR changes from 5.5 dB to 3.3 dB. In practice this can be realized by switching different matching network elements, typically capacitors, on and off by using either pin-diode or High Electron Mobility Transistor HEMT (basically a FET, Field-Effect Transistor, incorporating a high-mobility layer to enhance performance) switches. In future MEMS (Micro Electro Mechanical Systems) technology will provide more options for manufacturing high-quality components to realize low-loss tunable output matching circuits.

Figure 3A:
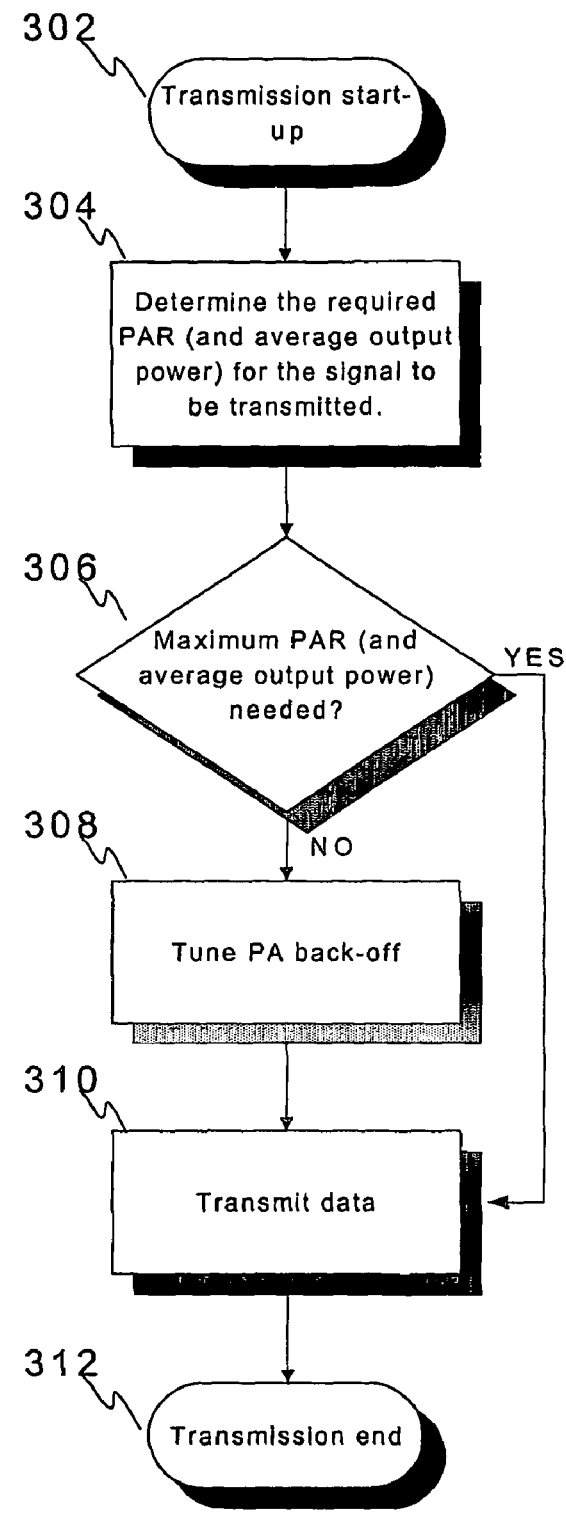
FIG. 3A is a high-level flow diagram disclosing one option for the overall process of adjusting PA back-off with terminal embedded PAR Control Logic.

FIG. 3A discloses a high-level flow diagram of the described embodiment of the invention wherein PAR control logic 206 embedded in a WCDMA mobile terminal supervises the adjustment of PA module 202 properties like PA 203 back-off by utilizing PAR value determined for the connection type. Upon connection initiation the terminal is aware of the connection parameters including transfer mode (HSDPA/normal WCDMA) information and therefore also related maximum PAR value in order to tune the transmitter properties. Also average output power information Pavg can be exploited in the adjustment procedure. In phase 302 the control logic 206 receives notification of a new connection to be established. The terminal deduces the required PAR for the transmission 304 based on the connection type/transfer mode information. If the determined value is equal to a maximum possible value, which is checked during phase 306, then the data transmission can be initiated immediately 310 without actual adjustment procedures as in this case the PAR is set maximum by default. Otherwise, PA back-off is first tuned during phase 308. The data transmission is ceased 312 by the connection release.

Figure 3B:
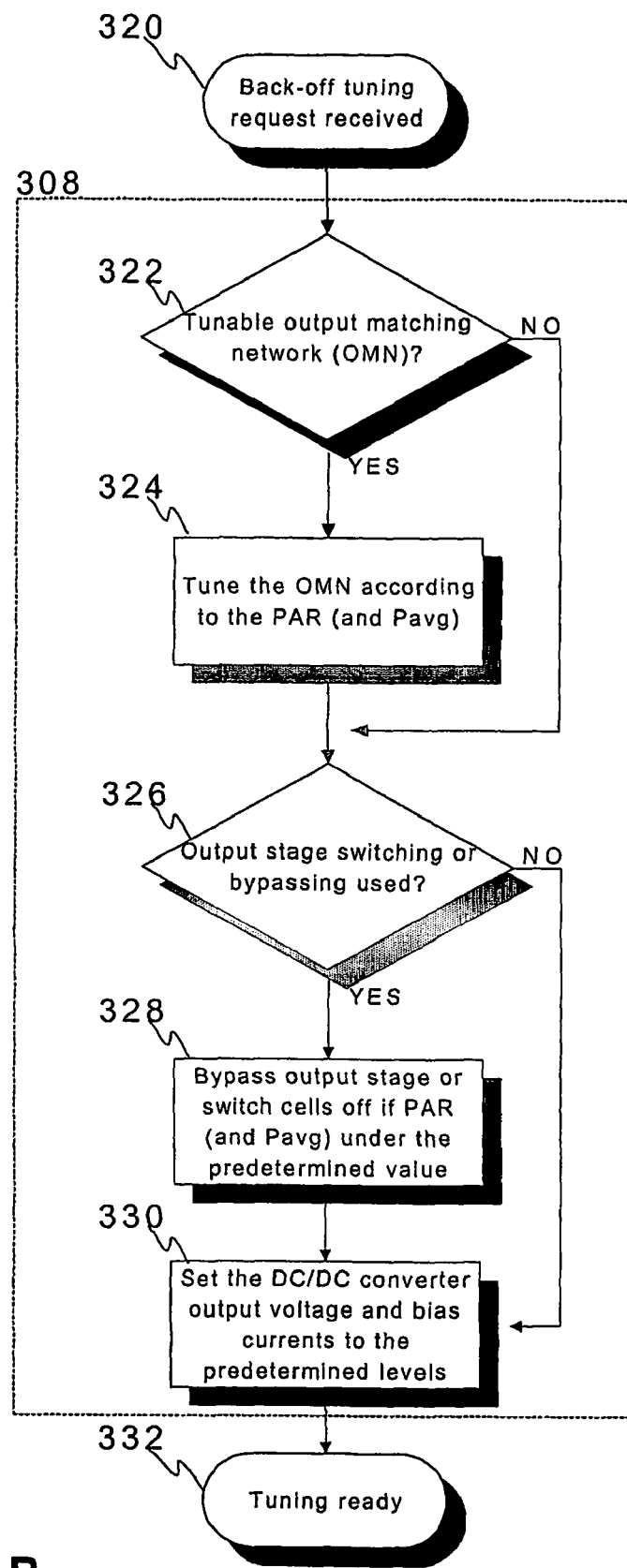
FIG. 3B is a more detailed flow diagram disclosing discrete steps of performing said adjustments.

FIG. 3B discloses a more detailed flow diagram of the actual PAR adjustment phase 308 internal events. Upon recognizing a back-off tuning request 320, PAR control logic 206 checks whether the OMN is available for the load impedance adjustment or not in phase 322. In the first case the OMN is tuned via PA module control means 232 according to the PAR and/or possibly Pavg 324, in the latter case the OMN tuning phase is not possible, e.g. not available, and thus skipped. Next, if amplifier output stage switching or bypassing is applicable 326, output stages are bypassed and/or cells switched off 328 if PAR (and/or Pavg) is under a predetermined limit. Finally, DC/DC converter output voltage, being in fact the amplifier supply voltage 216, and bias current 218 are set to predetermined levels by the corresponding tuning blocks 210, 208 which are controlled by the PAR control logic 206 via the control signal connections 230, 228. After above-presented adjustment measures the tuning phase is ended 332 and the overall data transmission process continues as proposed in FIG. 3A.

PAR control and tuning means 204, 206, 208, 210, may, for example, tune the amplifier 203 based on mappings between different peak-to-average and amplifier parameter values. The resulting parameter value can be either directly or inversely proportional to the peak-to-average value and a decrease in the obtained peak-to-average value is typically converted to a decrease but sometimes also, e.g. in the case of the amplifier output impedance 220, to an increase in the adjusted amplifier parameter value. Accordingly, a decrease in the peak-to-average value converts to a decrease in both the bias current 218 and the supply voltage 216. On a higher level, a decrease in the peak-to-average value is turned into a decrease in the amplifier back-off by the adjusting procedure to optimize the amplifier usage.

PAR control logic 206 can be implemented, for example, as a new standalone chip connected to other components providing the necessary input for the control via data buses, or as a dedicated software process embedded in an existing chip or to a plurality of existing chips, e.g. microcontrollers or DSPs (Digital Signal Processor) with optional external memories inside the terminal. Also programmable logic circuits may be applied. The checking of contemporary connection state, connection/transmission type/mode, available resources etc. shall be carried out with simple memory access operations by the control logic if the process is included in an existing chip already maintaining that information. Otherwise the information must be transferred from the other components first. The predetermined data including various threshold values for the decision making is stored in the control logic 226 or an accessible external memory chip. Additionally, the updated values may be received from the far-end of the connection as well. Message, e.g. PAR control requests and possible control messages more complex than just a control voltage, transfer between different software processes inside a single chip or between several at least partially independent components may be implemented as desired, however taking selected components' interfaces and other properties into account.

As proposed hereinbefore, basically three parameters Vcc, Ibias and Zload are adjusted based on the PAR value to alter the PA back-off. Additionally, amplifier output stages/cells may be bypassed/switched off. Concerning the implementation and realization aspects in practice, the following publications are referred to as providing advantageous advice on the related issues. U.S. Pat. No. 5,493,255 discloses a solution for bias current adjustment, namely a circuit for adjusting RF power amplifier bias-voltages as a function of power level, wherein the control by power level can be replaced by the PAR based control, or alternatively, a parallel PAR control may be presented in addition to the existing power level control. U.S. Pat. No. 6,301,467 concerns transmitter efficiency in relation to the PA output matching (Zload). PA supply voltage (Vcc) tuning is relatively well-known issue as such, and, for example, U.S. Pat. No. 4,442,407 discloses a one possible solution for the purpose as it suggests monitoring of input signal properties, e.g. signal amplitude, arriving to an RF amplifier and adjusting the amplifier supply voltage based on the gathered information with a control circuit.

Figure 4:
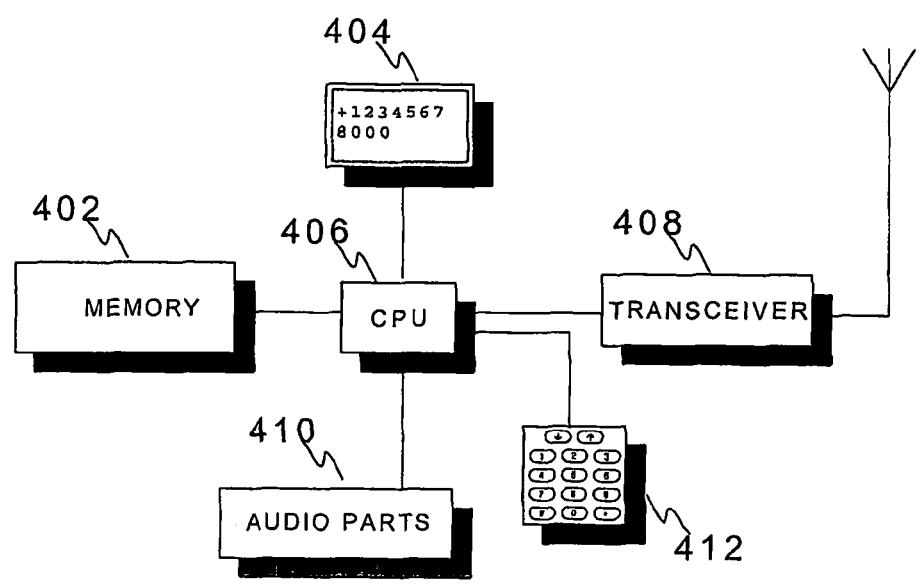
FIG. 4 is an exemplary block diagram of a device, substantially a wireless communications device like a mobile terminal, capable of executing the method of the invention.

Referring to FIG. 4, one option for the basic components of an electronic device, for example, a wireless communications device like a mobile terminal or a PDA (Personal Digital Assistant), capable of adjusting the PA properties as disclosed hereinbefore are depicted. A memory 402, divided into one or more physical memory chips and possibly combined with a processing unit 406, comprises instructions, e.g. in a form of a computer program/application, for executing the proposed method. Processing unit 406 is required e.g. for the control of various events performed by the terminal in accordance with the stored instructions. A display 404 and a user interface 412 are typically needed for providing necessary device control and data visualization means to the user. Transceiver 408 handles data transmission over air interface and includes also the components for executing the method of the invention disclosed in FIG. 2. Alternatively, PAR control logic of FIG. 2 may be at least partially included in the processing unit 406 to gain possible benefits, e.g. space and/or power consumption savings, achieved from concentrating the terminal controls in a single element. Audio parts 410 include e.g. transducers and amplifiers necessary for interfacing acoustic signals such as speech and music with said device.

The scope of the invention can be found in the following independent claims. However, utilized devices, method steps, data structures etc may vary significantly depending on the current scenario, still converging to the basic ideas of this invention. For example, it is clear that the invention may also be exploited in other devices than wireless communication devices if these devices include power amplifiers preferably controlled and controllable by input signal's PAR value. Furthermore, the presented embodiment suggested adjustment of PA properties like back-off in conjunction with a transmission start, e.g. a connection setup, but it may as well be performed intermittently during the data transfer if needed. Parameters, which are to be adjusted by the PAR, are not limited to the ones of the disclosed embodiment either. Finally, in some occasions the PAR control logic and PA tuning means may advantageously be at least partially combined. Therefore, the invention is not strictly limited to the embodiments described above.

The invention claimed is:

1. A method, comprising:
prior to wireless transmission of a data signal by an electronic device to a network element in a wireless communication system, the electronic device receiving signalling information from the network element relating to parameters for the wireless transmission of the data signal,
the electronic device deducing maximum peak-to-average ratio control information from the signalling information for adjusting properties of a power amplifier of the electronic device affecting power efficiency of the power amplifier in amplifying the data signal for the wireless transmission to the network element,
the electronic device adjusting the properties of the power amplifier including a load impedance of the power amplifier and at least two parameters of the power amplifier according to the deduced maximum peak-to-average information and mappings between the deduced maximum peak-to-average information and values of the at least two parameters of the power amplifier and the load impedance stored in a memory or control logic of the electronic device so that the power efficiency of the power amplifier is tuned by the adjusting of the load impedance and the values of the at least two parameters, wherein the at least two parameters of the power amplifier include a bias current for the power amplifier, and
after the tuning of the power efficiency of the power amplifier, the tuned power amplifier amplifying the data signal and the electronic device transmitting the amplified data signal in the wireless transmission to the network element in the wireless communication system.

2. The method of claim 1, wherein the at least two parameters of the power amplifier include a supply voltage of the power amplifier.

3. The method of claim 1, wherein said
maximum peak-to-average ratio
comprises a ratio of a peak envelope power to an average power.

4. The method of claim 1, wherein the adjusting is performed based on a comparison between a current peak-to-average value and a predetermined limit.

5. The method of claim 1, wherein the adjusting is substantially performed by bypassing amplifier output stages or switching cells off.

6. The method of claim 1, wherein the signalling information comprises at least one of the following: transfer mode, power offsets between codes and number of transmitted codes, transmitted codes, and subcarriers.

7. The method of claim 1, wherein the adjusting based on the mappings between the deduced information and values of the at least two parameters of the power amplifier and values of the load impedance avoids use of additional detectors or signals, or avoids computationally exhaustive calculations, or both.

8. The method of claim 4, wherein the at least two parameters include a parameter adjusted to a value that is either directly or inversely proportional to the current peak-to-average value.

9. The method of claim 4, wherein a decrease in the current peak-to-average value converts to an adjusted decrease or an adjusted increase in the parameter value.

10. The method of claim 4, wherein a decrease in the current peak-to-average value converts to an adjusted decrease in the bias current.

11. The method of claim 4, wherein the at least two parameters of the power amplifier include a supply voltage of the power amplifier and wherein a decrease in the current peak-to-average value converts to an adjusted decrease in the supply voltage.

12. The method of claim 1, wherein a decrease in the current peak-to-average value converts to an adjusted increase in the load impedance.

13. The method of claim 4, wherein a decrease in the obtained peak-to-average value converts to an adjusted decrease in amplifier back-off.

14. An apparatus, comprising:
a receiver for receiving signalling information from a network element of a wireless communication network value related to parameters for a wireless transmission of a data signal from the apparatus to the network element; and
a control device for deducing maximum peak-to-average ratio control information from the signalling information for adjusting properties of a power amplifier of the apparatus affecting power efficiency of the power amplifier in amplifying the data signal for the wireless transmission to the network element, the control device for adjusting the properties of the power amplifier including a load impedance of the power amplifier and at least two parameters of the power amplifier according to the deduced maximum peak-to-average control information and mappings between the deduced maximum peak-to-average control information and values of the at least two parameters of the power amplifier and the load impedance stored in a memory or control logic of the apparatus so that the power efficiency of the power amplifier is tuned by the adjusting of the load impedance and the values of the at least two parameters, wherein the at least two parameters of the power amplifier include a bias current for the power amplifier; and
a transmitter for transmitting the data signal amplified by the tuned power amplifier in the wireless transmission to the network element.

15. The apparatus of claim 14, wherein the at least two parameters include a supply voltage of the amplifier.

16. The apparatus of claim 14, comprising at least one of the following: a tunable bias controller, a tunable Direct Current to Direct Current converter, or a tunable Output Matching Network.

17. The apparatus of claim 14, wherein said maximum peak-to-average ratio comprises a ratio of a peak envelope power to an average power.

18. The circuit arrangement of claim 14, wherein the signalling information from the network element comprises at least one of the following: transfer mode, power offsets between codes and number of transmitted codes, information related to transmitted codes and information related to subcarriers.

19. The apparatus of claim 14, wherein the adjusting properties of the power amplifier based on the mappings between the deduced information and values of the at least two parameters of the power amplifier and the load impedance avoids use of additional detectors or signals, or avoids computationally exhaustive calculations, or both.

20. An apparatus comprising:
at least one processor; and
at least one memory including program code, the at least one memory and the computer program code configured to, with the at least one processor, cause the apparatus at least to:
receive signalling information from a network element relating to parameters for a wireless transmission of a data signal from the apparatus to the network element
deduce maximum peak-to-average ratio control information from the signalling information for adjusting properties of a power amplifier of the apparatus affecting power efficiency of the power amplifier in amplifying the data signal for the wireless transmission to the network element;
adjust the properties of the power amplifier including a load impedance of the power amplifier and at least two parameters of the power amplifier according to the deduced maximum peak-to-average ratio control information and mappings between the deduced maximum peak-to-average ratio information and values of the at least two parameters of the power amplifier stored in the memory so that the power efficiency of the power amplifier is tuned by the adjusting of the load impedance and the values of the at least two parameters, wherein the at least two parameters of the power amplifier include a bias current for the power amplifier.

21. The apparatus of claim 20, wherein said maximum peak-to-average ratio comprises a ratio of a peak envelope power to an average power.

22. The apparatus of claim 20, wherein the memory and the computer program code are configured to, with the processor to cause the apparatus at least to adjust at least one of the parameters based on a comparison between a current peak-to-average value and a predetermined limit.

23. The wireless communications device of claim 20, wherein the memory and the computer program code are configured to, with the processor, cause the apparatus at least to adjust at least one of the parameters substantially by bypassing amplifier output stages or switching cells off.

24. The apparatus of claim 20, wherein the signalling comprises at least one of the following: transfer mode, power offsets between codes and number of transmitted codes, information related to transmitted codes and information related to subcarriers.

25. The apparatus of claim 24, wherein the mappings between the deduced information and values of the at least two parameters of the power amplifier stored in the memory enables the adjusting of the properties of the power amplifier without requiring additional detectors or signals, or without computationally exhaustive calculations, or both.

26. An apparatus comprising:
a receiver for receiving signalling information from a network element of a wireless communication network from which a maximum peak-to-average value related to an amplifier input signal of a power amplifier in the apparatus is deducible and for providing control information based on the maximum peak-to-average value deduced from the received signalling information and based on mappings between different peak-to-average values and at least two amplifier parameter values;

at least two adjusting components for receiving the control information and adjusting a load impedance of the power amplifier and the at least two amplifier parameters based on the control information so that a back-off of the power amplifier is tuned by the adjusting the load impedance and the at least two amplifier parameters, the power amplifier functionally connected to the least two adjusting components according to the control information, wherein said at least two parameters of the power amplifier include a bias current for the power amplifier; and a transmitter, responsive to an output signal comprising the input signal amplified by the power amplifier tuned by the at least two adjusting components, for wirelessly transmitting the output signal to the network element.

27. The apparatus of claim 26, wherein said maximum peak-to-average ratio comprises a ratio of a peak envelope power to an average power.

28. The apparatus of claim 26, wherein the at least two adjusting components include at least one of the following: a tunable bias controller, a tunable Direct Current to Direct Current converter, or a tunable Output Matching Network.

29. The apparatus of 26, further comprising a device for obtaining an average power value of the power amplifier output signal, and wherein at least one of the at least two adjusting components is for adjusting at least one amplifier parameter according to the average power value.

30. The apparatus of claim 26 wherein the adjusting according to the peak-to-average value based on mapping of the peak-to-average value to a parameter value enables the adjusting without requiring additional detectors or signals, or without computationally exhaustive calculations, or both.

31. The apparatus of claim 26, wherein the signalling information comprises at least one of the following: transfer mode, power offsets between codes and number of transmitted codes, information related to transmitted codes, and information related to subcarriers.

32. An apparatus, comprising:
at least one processor and;
at least one memory including computer program code, the at least one memory and the computer program code configured to, with the at least one processor, cause the apparatus at least to:
receive signalling information from a network element in a wireless communication,
deduce a maximum peak-to-average value from the signalling information for adjusting properties of a power amplifier in the apparatus,
provide control information based on the deduced maximum peak-to-average value and mappings between different peak-to-average values and amplifier parameter values,
adjust a load impedance of the power amplifier and at least two amplifier parameters based on the control information so that a back-off of the power amplifier is tuned by adjusting the load impedance and the at least two parameters wherein the at least two parameters of the power amplifier include a bias current for the power amplifier, and
wirelessly transmit an output signal of the tuned power amplifier to the network element.

33. The apparatus of claim 32, wherein the at least two parameters include a supply voltage of the power amplifier.

34. The apparatus of claim 32, arranged to adjust at least one of the parameters based on a comparison between a current peak-to-average value and a predetermined limit.

35. The apparatus of claim 32, arranged to adjust an amplifier parameter of the at least two amplifier parameters substantially by bypassing amplifier output stages or switching cells off.

36. The apparatus of claim 32, wherein said maximum peak-to-average ratio comprises a ratio of a peak envelope power to an average power.

37. The apparatus of claim 36, which is a Universal Mobile Telecommunication System terminal.

38. A non-transitory memory storing a computer program including executable instructions for execution by a processor to cause an apparatus to:
receive wireless signalling information from a network element related to transmission of an input signal amplified by a power amplifier in the apparatus,
deduce a maximum peak-to-average value from the signalling information received by the apparatus from the wireless network element, and
adjust at least one property of the power amplifier according to the deduced maximum peak-to-average value and mappings between different peak-to-average values and the at least one property so that a back-off of the power amplifier is tuned by the adjusting of the at least one property of the power amplifier, and
send an output signal of the power amplifier wirelessly to the network element, the output signal comprising the input signal amplified by the power amplifier tuned by the adjusting of the at least one property of the power amplifier.

* * * * *

UNITED STATES PATENT AND TRADEMARK OFFICE
CERTIFICATE OF CORRECTION

| | | |
|---|---|---|
| PATENT NO. | : 8,041,315 B2 | Page 1 of 1 |
| APPLICATION NO. | : 10/547240 | |
| DATED | : October 18, 2011 | |
| INVENTOR(S) | : Miikka Hamalainen and Esko Jarvinen | |

It is certified that error appears in the above-identified patent and that said Letters Patent is hereby corrected as shown below:

On the title page, under (56) References Cited, U.S. PATENT DOCUMENTS,
"4,730,622  3/1988  Cohen" should be --4,370,622  1/1983  Hornbeck et al.--.

Signed and Sealed this
Twentieth Day of March, 2012

David J. Kappos
*Director of the United States Patent and Trademark Office*